(12) United States Patent
Lee et al.

(10) Patent No.: US 10,819,129 B2
(45) Date of Patent: Oct. 27, 2020

(54) BATTERY CHARGING SYSTEM INCLUDING BATTERY GAUGE

(71) Applicant: Electronics and Telecommunications Research Institute, Daejeon (KR)

(72) Inventors: Ja Yol Lee, Nonsan-si (KR); Bon Tae Koo, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 342 days.

(21) Appl. No.: 15/933,853

(22) Filed: Mar. 23, 2018

(65) Prior Publication Data

US 2018/0278072 A1    Sep. 27, 2018

(30) Foreign Application Priority Data

Mar. 24, 2017  (KR) .................. 10-2017-0037897

(51) Int. Cl.
*H02J 7/00*       (2006.01)
*G01R 31/3842*    (2019.01)

(52) U.S. Cl.
CPC ........ *H02J 7/0047* (2013.01); *G01R 31/3842* (2019.01); *H02J 7/00* (2013.01); *H02J 7/008* (2013.01); *H02J 7/0072* (2013.01); *H02J 7/0048* (2020.01)

(58) Field of Classification Search
CPC .......... H02J 7/0021; H02J 7/0047; H02J 7/00; H02J 7/0072; H02J 7/008; H02J 7/0048; H02J 7/027; H02J 7/1461; H02J 7/166; H02J 7/0077; H02J 7/0085; H02J 7/0088; H02J 7/025; G01R 31/3842
USPC ....................................................... 320/162
See application file for complete search history.

(56) References Cited

U.S. PATENT DOCUMENTS

| 7,646,135 B1 * | 1/2010 | Churchill .............. H01L 41/113 310/313 R |
| 7,952,324 B2 * | 5/2011 | Cheng ..................... H02J 50/10 320/108 |
| 8,373,388 B2 | 2/2013 | Kim et al. |
| 8,575,889 B2 * | 11/2013 | Platania ................ H02M 3/158 320/103 |
| 9,425,631 B2 * | 8/2016 | Furtner .................. H02J 7/0019 |
| 9,647,474 B2 * | 5/2017 | Fathollahi ............. H02J 7/0047 |

(Continued)

OTHER PUBLICATIONS

Tzu-Chi Huang et al., "Fast Charging and High Efficiency Switching-Based Charger With Continuous Built-In Resistance Detection and Automatic Energy Deliver Control for Portable Electronics", IEEE Journal of Solid-State Circuits, vol. 49, No. 7, pp. 1580-1594, Jul. 2014.

Min-Gyu Jeong et al., "Switching Battery Charger Integrated Circuit for Mobile Devices in a 130-nm BCDMOS Process", IEEE Transactions on Power Electronics, vol. 31, No. 11, pp. 7943-7952, Nov. 2016.

(Continued)

*Primary Examiner* — M Baye Diao
(74) *Attorney, Agent, or Firm* — Rabin & Berdo, P.C.

(57) ABSTRACT

Provided is a battery charging system including a battery gauge configured to scale down to indicate a charging capacity of a battery, a charging mode switching unit configured to monitor a charging state of the battery gauge, switch a charging mode according to the charging state of the battery gauge, and charge the battery according to the switched charging mode, and a battery charging control unit configured to receive a charging current input to the battery gauge and a battery charging current input to the battery, and control the charging mode switching unit.

10 Claims, 4 Drawing Sheets

(56) References Cited

U.S. PATENT DOCUMENTS

| | | | | |
|---|---|---|---|---|
| 10,338,147 | B2* | 7/2019 | Nishiyama | G01R 31/367 |
| 10,536,021 | B2* | 1/2020 | Jung | H02J 7/007188 |
| 10,566,832 | B2* | 2/2020 | Mack | H02J 7/0029 |
| 2006/0022635 | A1* | 2/2006 | Li | H02J 7/022 |
| | | | | 320/107 |
| 2008/0278115 | A1* | 11/2008 | Huggins | H01M 10/615 |
| | | | | 320/134 |
| 2011/0156532 | A1* | 6/2011 | Churchill | G01L 1/26 |
| | | | | 310/319 |
| 2014/0062207 | A1* | 3/2014 | Lu | G06F 1/263 |
| | | | | 307/80 |
| 2016/0353391 | A1 | 12/2016 | Lee et al. | |
| 2019/0383880 | A1* | 12/2019 | Naskali | H01M 10/44 |

OTHER PUBLICATIONS

Kyunghoon Chung et al., "A Fast and Compact Charger for Li-Ion Battery Using Successive Built-In Resistance Detection", IEEE Transactions on Circuits and Systems II: Express Briefs, pp. 1-5, 2016.

Chia-Hsiang Lin et al., "A Li-Ion Battery Charger With Smooth Control Circuit and Built-In Resistance Compensator for Achieving Stable and Fast Charging", IEEE Transactions on Circuits and Systems-I: Regular Papers, vol. 57, No. 2, pp. 506-517, Feb. 2010.

Rosario Pagano et al., "A 0.18-μm Monolithic Li-Ion Battery Charger for Wireless Devices Based on Partial Current Sensing and Adaptive Reference Voltage", IEEE Journal of Solid-State Circuits, vol. 47, No. 6, pp. 1355-1368, Jun. 2012.

* cited by examiner

BATTERY CHARGING SYSTEM INCLUDING BATTERY GAUGE

CROSS-REFERENCE TO RELATED APPLICATIONS

This U.S. non-provisional patent application claims priority under 35 U.S.C. § 119 to Korean Patent Application No. 10-2017-0037897, filed on Mar. 24, 2017, in Korean Intellectual Property Office, the entire contents of which are hereby incorporated by reference.

BACKGROUND

The present disclosure herein relates to battery charging, and more particularly, to a battery charging system including a battery gauge.

Nowadays, a research on a multisource energy harvest technology for the Internet of Things (IoT) is being actively carried out, and a demand therefor seems to increase every year. The energy harvest, which is a technology for collecting and storing unused energies in a natural environment, is getting the limelight as a future alternative energy source. In addition, the energy harvest is an environment-friendly energy collecting technology and is a field where active technical development is necessary in the present and future earth where energy sources are being gradually exhausted. Accordingly, the core of the energy harvest technology lies in an energy converting element for converting prevalent light, heat, electrical wave, or kinetic energy source into usable energy, or an analog conversion circuit, and focuses on a high efficiency research.

SUMMARY

The present disclosure provides a battery charging system for shortening a battery charging time, and increasing a power conversion efficiency.

An embodiment of the inventive concept provides a battery charging system including: a battery gauge configured to scale down to indicate a charging capacity of a battery; a charging mode switching unit configured to monitor a charging state of the battery gauge, switch a charging mode according to the charging state of the battery gauge, and charge the battery according to the switched charging mode; and a battery charging control unit configured to receive a charging current input to the battery gauge and a battery charging current input to the battery, and control the charging mode switching unit.

In an embodiment, the battery gauge may include a capacitor circuit configured to scale down and charge the charging capacity of the battery. The capacitor circuit may scale down the charging capacity of the battery by 1/N times, where N is a natural number greater than 1. The battery gauge may further include a resistor circuit having a same resistance value as a parasitic resistance of the capacitor circuit, wherein the resistance circuit receives the charging current.

In an embodiment, the charging mode switching unit may include: a current detection and scale-down circuit configured to detect a current flowing through an inductor, and generate the charging current and a reference current based on the detected inductor current; a reference voltage generator configured to receive the reference current from the current detection and scale-down circuit, and generate a reference voltage; a voltage subtractor configured to calculate a parasitic voltage and output a replica battery voltage using an error voltage and a replica battery charging voltage applied across the capacitor circuit; a first error amplifier configured to compare a voltage applied across the resistor circuit and the parasitic voltage input from the voltage subtractor, and generate the error voltage; and a second error amplifier configured to compare the reference voltage, the replica battery voltage output from the voltage subtractor, and a battery charging voltage, and generate a comparison voltage according to a comparison result.

In an embodiment, the charging mode switching unit may further include a charging transistor configured to control the battery charging voltage by adjusting a current amount of the battery charging current according to a voltage level of the comparison voltage of the second error amplifier. The charging mode switching unit may further include: a first driving transistor having one terminal receiving an input voltage and another terminal connected to the inductor; and a second driving transistor connected to the other terminal of the first driving transistor and a ground terminal.

In an embodiment, the first driving transistor may be a p-channel metal-oxide-semiconductor field effect transistor (PMOS transistor), the second driving transistor may be an n-channel MOS transistor (NMOS transistor), and the charging transistor may be a PMOS transistor.

In an embodiment, the battery charging control unit may receive, the charging current, the inductor current, the battery charging current, a output voltage of the current detection and scale-down circuit, and the comparison voltage, and control the inductor current.

In an embodiment, the second error amplifier may generate the comparison voltage for switching a trickle charging mode to a precharging mode by comparing the reference voltage and the battery charging voltage. The second error amplifier may generate the comparison voltage for switching a constant current mode to a constant voltage mode by comparing the reference voltage, the replica battery voltage, the battery charging voltage.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, an exemplary embodiment of the present disclosure will be described in detail with reference to the accompanying drawings such that a person skilled in the art may easily carry out the embodiments of the present disclosure.

Figure 1:
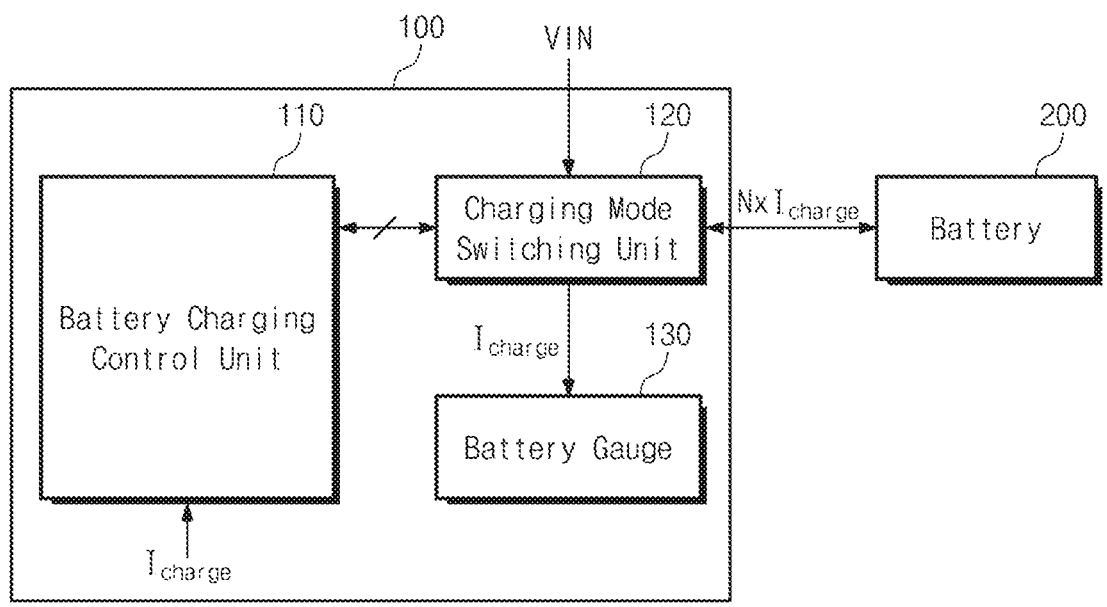
FIG. 1 is a block diagram of an exemplary battery charging system according to an embodiment of the inventive concept.

FIG. 1 is a block diagram of an exemplary battery charging system according to an embodiment of the inventive concept. As a circuit for charging a battery 200, a battery charging system 100 as illustrated in FIG. 1 may have a trickle charging mode, a precharge mode, and a constant voltage mode. The battery charging system 100 may charge the battery 200 in a high speed or low speed by switching to various modes. For example, the high speed charging mode may be a constant current mode, and the low speed charging mode may be a constant voltage mode. Referring to FIG. 1, the battery charging system 100 may include a battery charging control unit 110, a charging mode switching unit 120, and a battery gauge 130.

The battery charging control unit 110 may be implemented to control the entire operation of the battery charging system 100. For example, the battery charging control unit 110 may control the charging mode switching unit 120 to charge the battery 200 using charging mode-related information (e.g., internal current or voltage information, etc.) provided from the charging mode switching unit 120.

For example, when the charging mode is a high speed charging mode, the battery charging control unit 110 may control the charging mode switching unit 120 to provide battery charging current, i.e., $N \times I_{charge}$ to the battery 200. Here, N may be a natural number, but in a broad sense, may also include a real number. $I_{charge}$ is a charging current provided to the battery gauge 130. On the other hand, when the charging mode is a low speed charging mode, the battery charging control unit 110 may control the charging mode switching unit 120 to provide a constant voltage to the battery 200.

The charging mode switching unit 120 may monitor a charging state of the battery gauge 130, and may switch the charging mode to charge the battery 200 in a high or low speed according to the charging state of the battery gauge 130. For example, when the charging state of the battery gauge 130 is smaller than a predetermined value or a predetermined level, the charging mode switching unit 120 may switch the charging mode to the high speed charging mode. On the other hand, when the charging state of the battery gauge 130 is the predetermined value or greater, the charging mode switching unit 120 may switch the charging mode to the low speed charging mode.

The charging mode switching unit 120 may be implemented to receive an input voltage $V_{IN}$ and charge the battery 200 according to a proper charging mode. Here, the input voltage $V_{IN}$ may be a voltage provided in a wired manner or a voltage received wirelessly. For example, the input voltage $V_{IN}$ may be a DC power source provided from a battery charger. The battery charger may include a travel adapter for charging a mobile device such as a smartphone. The input voltage $V_{IN}$ may be a voltage corresponding to wireless power generated according to inductor resonance, electromagnetic inductive coupling, or resonant magnetic coupling, etc. Besides, the input voltage $V_{IN}$ may be voltage generated by a multisource energy harvest technology.

In relation to FIG. 1, the battery gauge 130 may be implemented with a circuit to which an equivalent circuit (configured from passive elements) of the battery 200 is scaled down. For example, when the charging capacity of the battery 200 is N, the charging capacity of the battery gauge 130 may be represented as 1. The battery gauge 130 may receive the charging current $I_{charge}$ and charge a replica battery (e.g., capacitor). The battery gauge 130 is a circuit for indicating the charging state of the battery 200 and may be implemented in various manners. An internal configuration and operation principle of the battery gauge 130 will be described in detail in relation to FIG. 2.

Figure 2:
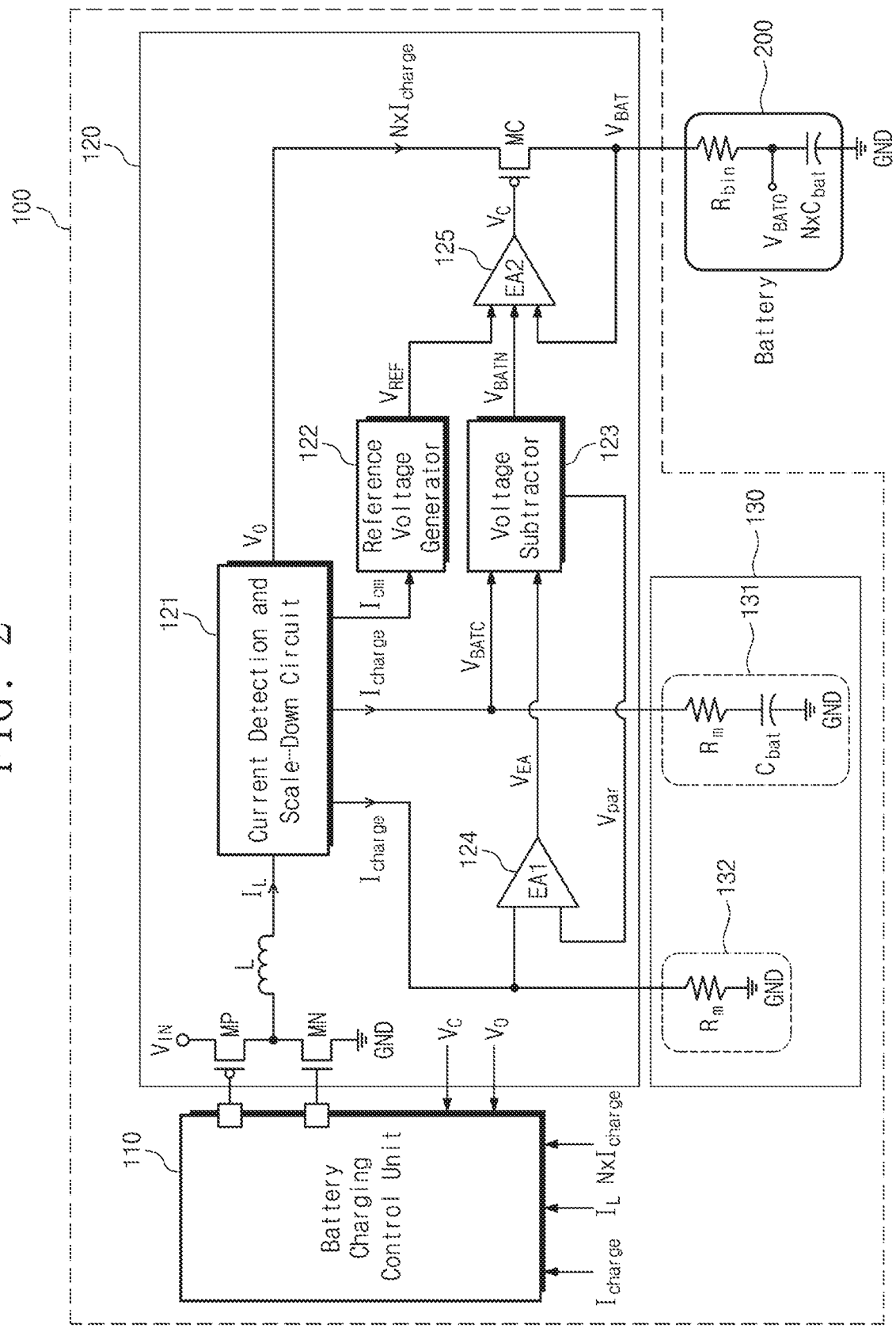
FIG. 2 is a circuit diagram exemplarily showing the battery charging system illustrated in FIG. 1.

FIG. 2 is a circuit diagram exemplarily showing the battery charging system illustrated in FIG. 1. Referring to FIG. 2, the battery charging system 100 may include the battery charging control unit 110, the charging mode switching unit 120, and the battery gauge 130. Here, the battery gauge 130 may be implemented in an on-chip type.

The battery charging control unit 110 may be implemented to receive currents $I_{charge}$, $I_L$, and $N \times I_{charge}$, and voltages Vc and Vo corresponding to a charging mode from the charging mode switching unit 120, and to drive corresponding driving transistors MP and MN. Here, $I_{charge}$ is a charging current provided to the battery gauge 130. $I_L$ is an inductor current flowing through an inductor L. $N \times I_{Large}$ is a battery charging current provided to the battery 200. In addition, Vc is a comparison voltage applied to a gate terminal of the charging transistor MC, and Vo is an output voltage provided to the charging transistor MC.

The charging mode switching unit 120 may include a current detection and scale-down circuit 121, a reference voltage generator 122, a voltage subtractor 123, a first error amplifier EA1 124, a second error amplifier EA2 125, the first and second driving transistors MP and MN, a charging transistor MC, and an inductor L. Here, the reference voltage generator 122 may be a band-gap reference.

The first and second driving transistors MP and MN may be connected serially between a power input terminal and a ground terminal. The first and second driving transistors MP and MN may be turned on/off under a control of the battery charging control unit 110, and adjust the inductor current $I_L$ flowing through the inductor L. The first driving transistor MP may be connected between the power input terminal to which the input voltage $V_{IN}$ is received, and the inductor L. For example, the first driving transistor MP may be implemented with a p-channel metal-oxide-semiconductor field effect transistor (PMOS transistor). The second driving transistor MN may be connected between the first driving transistor MP and the ground terminal GND. For example, the second driving transistor MN may be implemented with an n-channel MOS transistor (NMOS transistor).

The current detection and scale-down circuit 121 may be implemented to receive, as an input, the inductor current $I_L$ from the inductor L, and to output the charging current $I_{charge}$, the reference current $I_{cm}$, and the battery charging current $N \times I_{charge}$. The current detection and scale-down circuit 121 may be implemented with an analog circuit. However, it should not be understood that the current detection and scale-down circuit 121 is always implemented only with the analog circuit.

The charging current $I_{charge}$ may be adjusted to have a current amount corresponding to 1/N of the battery charging current $N \times I_{charge}$. Here, N may be a natural number and in a broad sense, may be a real number. The charging current may be used for charging a capacitor circuit 131. The reference current $I_{cm}$ is an arbitrary current value scaled down from the charging current $N \times I_{charge}$, and may be provided as a reference current source of the reference voltage generator 122.

The battery gauge 130 may include the capacitor circuit 131 and a resistor circuit 132. The capacitor circuit 131 may be connected between the current detection and scale-down circuit 121 and the ground terminal GND. The capacitor circuit 131 may include a resistor $R_m$ and the capacitor $C_{bat}$. Here, the resistor $R_m$ may be a parasitic resistor. The capacitor $C_{bat}$ of the capacitor circuit 131 may have the capacitance corresponding to 1/N of the capacitor $N \times C_{bat}$ of the battery 200. Here, N may be a natural number and in a broad sense, may be a real number. The resistor $R_m$ of the resistor circuit 132 may have the same resistance value as the resistor $R_m$ of the capacitor circuit 131. The resistor $R_m$ of the resistor circuit 132 may be implemented with a metal resistor. Here, the capacitor circuit 131 may be implemented with an on-chip capacitor and the resistor circuit 132 may be implemented with an on-chip resistor.

The voltage subtractor 123 may receive a replica battery charging voltage $V_{BATC}$ and an error voltage $V_{EA}$. Here, the replica battery charging voltage $V_{BATC}$ is a voltage charged in the capacitor circuit 131, and the error voltage $V_{EA}$ is an output voltage of the first error amplifier EA1 124. The voltage subtractor 123 is an analog circuit for subtracting a parasitic voltage $V_{par}$ caused by a serial resistance component $R_m$ of the capacitor circuit 131. The voltage subtractor 123 may output a replica battery voltage $V_{BATN}$.

The first error amplifier EA1 124 may receive the voltage $R_m * I_{charge}$ applied across the resistor circuit 132 and the parasitic voltage $V_{par}$ extracted from the voltage subtractor 123. The first error amplifier EA1 124 is an amplifier for comparing the parasitic voltage $V_{par}$ and the voltage applied across the resistor circuit 132 and correcting an error. The first error amplifier EA1 124 may output the error voltage $V_{EA}$.

The second error amplifier EA2 125 may receive the reference voltage $V_{REF}$ of the reference voltage generator 122, the replica battery voltage $V_{BATN}$ of the voltage subtractor 123, and the battery charging voltage $V_{BAT}$. The second error amplifier EA2 125 may compare the reference voltage $V_{REF}$, the replica battery voltage, and the battery charging voltage $V_{BAT}$ to output a comparison voltage Vc for controlling the charging transistor MC.

The battery 200 may include a battery resistor $R_{bin}$ and a battery capacitor $N \times C_{bat}$. Here, the battery resistor $R_{bin}$ is a parasitic resistor of the battery capacitor $N \times C_{bat}$. The battery output voltage $V_{BAT0}$ may be a voltage between the battery resistor $R_{bin}$ and the battery capacitor $N \times C_{bat}$.

Figure 3:
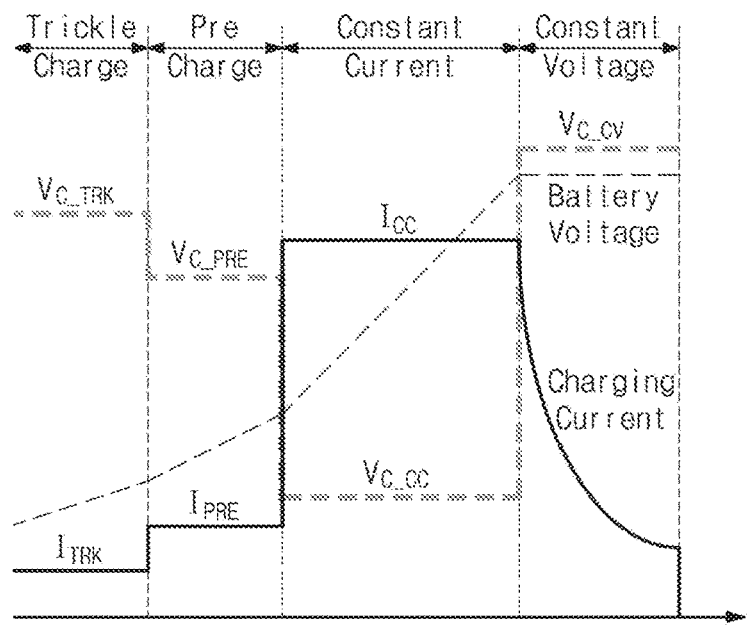
FIG. 3 is a graph exemplarily showing a battery charging process of the battery charging system illustrated in FIG. 2.

FIG. 3 is a graph exemplarily showing a battery charging process of the battery charging system illustrated in FIG. 2. In relation to FIG. 3, charging modes of the battery charging system 100 of the inventive concept may include a trickle charging mode, a precharge mode, a constant current mode, and a constant voltage mode. In FIG. 3, a relationship between the charging current and the battery voltage is illustrated in each charging mode.

In the trickle charging mode, a trickle current $I_{TRK}$ and a trickle constant voltage $V_{C\_TRK}$ may be provided to the battery 200. Then in the precharge mode, a precharging current $I_{PRE}$ and a precharge constant voltage $V_{C\_PRE}$ may be provided to the battery 200. Here the precharging current $I_{PRE}$ is higher than the trickle current $I_{TRK}$. In the constant current mode, a constant current $I_{CC}$ and the constant voltage $V_{C\_CC}$ may be provided to the battery 200. The constant current $I_{CC}$ is exceptionally higher than the precharging current $I_{PRE}$. The battery 200 may be charged in a high speed by the constant current $I_{CC}$. In this period, the battery charging voltage $V_{BAT}$ may sharply increases. When the battery 200 is completely charged, the battery charging voltage $V_{BAT}$ becomes constant. At this point, the battery charging system 100 enters a constant voltage mode. In the constant voltage mode, the constant voltage $V_{C\_CV}$ is applied to the battery 200.

In this way, the battery charging system 100 may operate in any one operation mode among the trickle charging mode, the precharge mode, the constant current mode, and the constant voltage mode by monitoring the magnitude of the charging mode $I_{charge}$ provided to the battery gauge 130.

To replicate a complete charging voltage of the battery 200, the battery charging system 100 may use the on-chip capacitor $C_{bat}$ having a storage capacity N times smaller than the battery charging storage capacity and the charging current $I_{charge}$ N times smaller than the battery charging current $N \times I_{charge}$. The replica battery voltage $V_{BATN}$ of the battery charging system 100 may be used as the comparison voltage Vc for switching the constant current mode to the constant voltage mode.

As described above, although undergoing the same charging process as the typical case, the battery charging system 100 according to an embodiment of the inventive concept may include the capacitor circuit 131 and the resistor circuit 132 to replicate the complete charging voltage of the battery 200. Since detecting the charging current $I_{charge}$ and including the current detection and scale-down circuit 121 for reducing the current magnitude, the battery charging system 100 may generate the replica battery voltage $V_{BATN}$ and adjust the comparison voltage Vc. The battery charging system 100 may accurately and rapidly move from the constant current mode to the charging mode.

In addition, the battery charging system 100 according to an embodiment of the inventive concept may be implemented to make a phase very close to and be locked to a reference clock. In addition, when comparing with a typical circuit, the battery charging system 100 according to the inventive concept has a small control circuit and calibration circuit, which results the area and power consumption reduced and a power transform efficiency improved.

Figure 4:
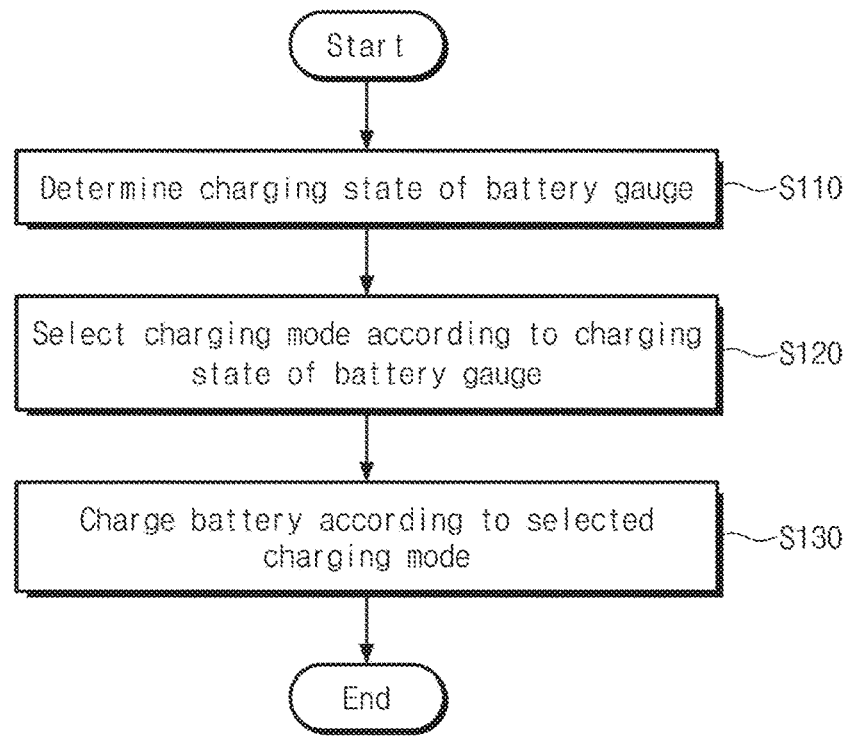
FIG. 4 is a flowchart exemplarily showing an operation method of a battery charging system according to an embodiment of the inventive concept.

FIG. 4 is a flowchart exemplarily showing an operation method of the battery charging system 100 according to an embodiment of the inventive concept. Referring to FIGS. 1 to 4, an operation method of the battery charging system 100 will be as follows.

In operation S110, a charging mode switching unit 120 may determine a charging state of the battery gauge 130. For example, a charging state of the capacitor $C_{bat}$ of the capacitor circuit 131 is monitored, the replica battery voltage $V_{BATN}$ and the reference voltage $V_{REF}$ are compared to determine the charging state illustrated in FIG. 3.

In operation S120, the charging mode switching unit 120 may select a charging mode according to the charging state of the battery gauge 130. For example, as illustrated in FIG. 3, the charging mode switching unit 120 may change the level of the comparison voltage Vc corresponding to the charging mode.

In operation S130, the battery 200 may be charged according to the selected charging mode. In other words, according to the level of the comparison voltage Vc, the charging mode switching unit 120 may provide a constant current $I_{CC}$ for the battery 200, discharge the constant current $I_{CC}$, or provide the constant voltage $V_{C\_CC}$.

Figure 5:
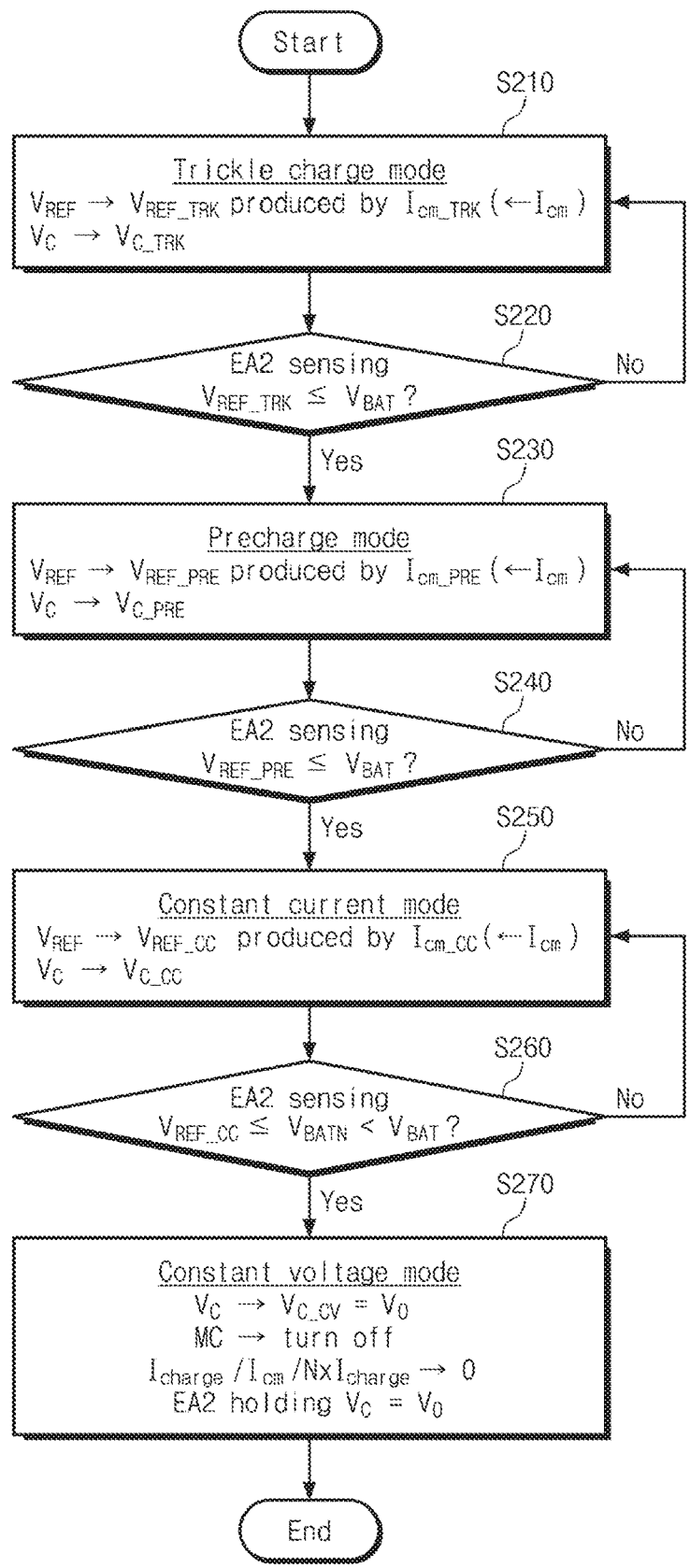
FIG. 5 is a flowchart for explaining in detail a charging mode selection method of the battery charging system according to an embodiment of the inventive concept.

FIG. 5 is a flowchart for explaining in detail a charging mode selection method of the battery charging system according to an embodiment of the inventive concept. Hereinafter, referring to FIGS. 2 and 3, a method of selecting a charging mode of the battery charging system 100 will be sequentially described.

In operation S210, a trickle charging mode is performed. In trickle charging mode, a trickle reference current $I_{cm\_TRK}$ is (indicated as $I_{TRK}$ in FIG. 3) input to the reference voltage generator 122. The reference voltage generator 122 receives the trickle reference current $I_{cm\_TRK}$ and provides a trickle comparison voltage $V_{REF\_TRK}$ to the second error amplifier 125. On the other hand, in the trickle charging mode, the second error amplifier 125 outputs the trickle comparison voltage $V_{C\_TRK}$.

In operation S220, the second error amplifier 125 senses and compares input voltages. The second error amplifier 125 determines whether the battery charging voltage $V_{BAT}$ is greater than or equal to the trickle comparison voltage $V_{C\_TRK}$. When the battery charging voltage $V_{BAT}$ is smaller than trickle comparison voltage $V_{C\_TRK}$ (No), the trickle charging mode is performed. When the battery charging voltage $V_{BAT}$ is greater than or equal to trickle comparison voltage $V_{C\_TRK}$ (Yes), the process proceeds to operation S230 and the precharging mode is performed.

In operation S230, the precharge mode is performed. In the precharge mode, a precharge reference current $I_{cm\_PRE}$ (indicated as $I_{PRE}$ in FIG. 3) is input to the reference voltage generator 122. The reference voltage generator 122 receives the precharge reference current $I_{cm\_PRE}$, and provides the precharge comparison voltage $V_{REF\_PRE}$ to the second error amplifier 125. On the other hand, in the precharge mode, the second error amplifier 125 outputs the precharge comparison voltage $V_{C\_PRE}$. As shown in the example of FIG. 3, the precharge reference current $I_{PRE}$ is greater than the trickle reference current $I_{TRK}$, and the precharge comparison voltage $V_{C\_PRE}$ is smaller than the trickle comparison voltage $V_{C\_TRK}$.

In operation S240, the second error amplifier 125 determines whether the battery charging voltage $V_{BAT}$ is equal to or greater than the precharge comparison voltage $V_{C\_PRE}$. When the battery charging voltage $V_{BAT}$ is smaller (No direction), the process returns to operation S230 and the precharge mode is performed. When the battery charging voltage $V_{BAT}$ is greater than or equal to (Yes direction), the process moves to operation S250 and the constant current mode is performed.

In operation S250, the constant current mode is performed. In the constant current mode, the constant current reference current $I_{cm\_CC}$ (indicated as $I_{CC}$ in FIG. 3) is input to the reference voltage generator 122. When receiving the constant current reference current $I_{cm\_CC}$, the reference voltage generator 122 provides a constant current comparison voltage $V_{REF\_CC}$ to the second error amplifier 125. On the other hand, in the constant current mode, the second error amplifier 125 outputs the constant current comparison voltage $V_{C\_CC}$. As shown in an example of FIG. 3, the constant current reference current $I_{CC}$ is very greater than the precharge reference current $I_{PRE}$, and the constant current comparison voltage $V_{C\_CC}$ is very smaller than the precharge comparison voltage $V_{C\_PRE}$.

In operation S260, the second error amplifier 125 determines whether the battery charging voltage $V_{BAT}$ is smaller than the replica battery voltage $V_{BATN}$ and the replica battery voltage $V_{BATN}$ is greater than or equal to the constant current comparison voltage $V_{C\_CC}$. When such a condition is not satisfied (No), the process returns to operation S250 and the constant current charging mode is performed. When such a condition is satisfied (Yes), the process returns to operation S270 and the constant voltage mode is performed.

In operation S270, the constant voltage mode is performed. The constant voltage mode may be performed, when the replica battery voltage $V_{BATN}$ is greater than or equal to the constant current comparison voltage $V_{C\_CC}$ and smaller than the battery charging voltage $V_{BAT}$. In the constant voltage mode, the second error amplifier 125 output the constant voltage comparison voltage $C_{C\_CV}$. Here, the constant voltage comparison voltage $V_{C\_CV}$ reaches the level of the output voltage $V_O$ of the current detection and scale-down circuit. At this point, the charging transistor MC becomes a turn-off state. In addition, the charging current $I_{charge}$, the reference current $I_{cm}$, and the battery charging current $N \times I_{charge}$ become lowered to 0. The second error amplifier 125 may be maintained to be the same level as that of the output voltage $V_O$.

The battery charging system according to an embodiment of the inventive concept includes the battery gauge to replicate the complete charging voltage. The battery charging system according to an embodiment of the inventive concept may accurately and rapidly switch a charging mode by comparing the battery charging voltage, the replica battery voltage, and the reference voltage with each other.

The battery charging system according to embodiments of the present disclosure may use the battery gauge to replicate the complete charging voltage and accurately and rapidly switch a charging mode by comparing the battery charging voltage, the replica battery voltage and the reference voltage with each other.

On the other hand, the foregoing description is about specific embodiments for practicing the present disclosure. The present disclosure encompasses the technical spirit of abstract and conceptual idea that may be used as a future technology as well as specific and actually useable means.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed.

What is claimed is:

1. A battery charging system comprising:
   a battery gauge configured to scale down to indicate a charging capacity of a battery;
   a charging mode switching unit configured to monitor a charging state of the battery gauge, switch a charging mode according to the charging state of the battery gauge, and charge the battery according to the switched charging mode; and
   a battery charging control unit configured to receive a charging current input to the battery gauge and a battery charging current input to the battery, and control the charging mode switching unit,
   wherein the battery gauge comprises a capacitor circuit configured to scale down and charge the charging capacity of the battery.

2. The battery charging system of claim 1, wherein the capacitor circuit is further configured to scale down the charging capacity of the battery by 1/N times, where N is a natural number greater than 1.

3. The battery charging system of claim 1, wherein the battery gauge further comprises a resistor circuit having a same resistance value as a parasitic resistance of the capacitor circuit, and
   wherein the resistance circuit is configured to receive the charging current.

4. The battery charging system of claim 3, wherein the charging mode switching unit comprises:
   a current detection and scale-down circuit configured to detect a current flowing through an inductor, and generate the charging current and a reference current based on the detected inductor current;
   a reference voltage generator configured to receive the reference current from the current detection and scale-down circuit, and generate a reference voltage;
   a voltage subtractor configured to calculate a parasitic voltage and output a replica battery voltage using an error voltage and a replica battery charging voltage applied across the capacitor circuit;

a first error amplifier configured to compare a voltage applied across the resistor circuit and the parasitic voltage input from the voltage subtractor, and generate the error voltage; and a second error amplifier configured to compare the reference voltage, the replica battery voltage output from the voltage subtractor, and a battery charging voltage, and generate a comparison voltage according to a comparison result.

5. The battery charging system of claim 4, wherein the charging mode switching unit further comprises a charging transistor configured to control the battery charging voltage by adjusting a current amount of the battery charging current according to a voltage level of the comparison voltage of the second error amplifier.

6. The battery charging system of claim 5, wherein the charging mode switching unit further comprise:

a first driving transistor having one terminal receiving an input voltage and another terminal connected to the inductor; and a second driving transistor connected to the other terminal of the first driving transistor and a ground terminal.

7. The battery charging system of claim 6, wherein the first driving transistor is a p-channel metal-oxide-semiconductor field effect transistor (PMOS transistor), the second driving transistor is an n-channel MOS transistor (NMOS transistor), and the charging transistor is a PMOS transistor.

8. The battery charging system of claim 4, wherein the battery charging control unit is further configured to receive the charging current, the inductor current, the battery charging current, a output voltage of the current detection and scale-down circuit, and the comparison voltage, and control the inductor current.

9. The battery charging system of claim 8, wherein the second error amplifier is further configured to generate the comparison voltage for switching a trickle charging mode to a precharge mode by comparing the reference voltage and the battery charging voltage.

10. The battery charging system of claim 8, wherein the second error amplifier is further configured to generate the comparison voltage for switching a constant current mode to a constant voltage mode by comparing the reference voltage, the replica battery voltage, and the battery charging voltage.

* * * * *